(12) United States Patent
Gaudette et al.

(10) Patent No.: US 8,630,829 B1
(45) Date of Patent: *Jan. 14, 2014

(54) COMPUTER AIDED DESIGN ENVIRONMENT WITH ELECTRICAL AND ELECTRONIC FEATURES

(75) Inventors: Thomas Gaudette, Jamaca Plain, MA (US); Pieter J. Mosterman, Framingham, MA (US)

(73) Assignee: The MathWorks, Inc., Natick, MA (US)

(*) Notice: Subject to any disclaimer, the term of this patent is extended or adjusted under 35 U.S.C. 154(b) by 1225 days.

This patent is subject to a terminal disclaimer.

(21) Appl. No.: 11/780,383

(22) Filed: Jul. 19, 2007

(51) Int. Cl.
*G06G 7/48* (2006.01)

(52) U.S. Cl.
USPC .................................. 703/6; 703/13

(58) Field of Classification Search
CPC .................. G06F 17/5009; G06F 17/5022
USPC .............................. 703/2, 6, 13, 17
See application file for complete search history.

(56) References Cited

U.S. PATENT DOCUMENTS

| 5,815,154 | A | 9/1998 | Hirschtick et al. |
| 6,184,901 | B1 | 2/2001 | Silva et al. |
| 6,219,049 | B1 | 4/2001 | Zuffante et al. |
| 6,219,628 | B1 * | 4/2001 | Kodosky et al. ............ 703/2 |
| 6,823,283 | B2 | 11/2004 | Steger et al. |
| 7,076,411 | B2 * | 7/2006 | Santori et al. ............... 703/6 |
| 7,086,028 | B1 | 8/2006 | Davis et al. |
| 7,159,183 | B1 | 1/2007 | Kudukoli et al. |

OTHER PUBLICATIONS

Han et al, "Object-Oriented Libraries of Physical Components in Simulation and Design", 2001, Dept. Electrical and Computer Engineering Carnegie Mellon University, pp. 1-8.*
Gaudette, et al., Computer Aided Design Environment with Electrical and Electronic Features, U.S. Appl. No. 11/840,852, filed Aug. 17, 2007, 45 pages.
Sinha, Rajarishi, et al., "Integration of Mechanical CAD and Behavioral Modeling," IEEE/ACM International Workshop on Behavioral Modeling and Simulation, Oct. 2000, pp. 1-6.
Roboworks, http://www.bewtonium.com/public_html/Products/RoboWorks_faq.htm and http://www.newtonium.com/public_html/Products/RoboWorks/RoboWorks_support.htm, accessed and printed Dec. 19, 2012, retrieved from the internet archive, archival date Jun. 12, 2002, 11 pages.

* cited by examiner

*Primary Examiner* — Kamini S Shah
*Assistant Examiner* — Luke Osborne
(74) *Attorney, Agent, or Firm* — Cesari and McKenna, LLP; Michael R. Reinemann

(57) ABSTRACT

In one embodiment, a Computer Aided Design (CAD) environment is configured to maintain a model of a system. The CAD environment includes a plurality of predefined transducers, and a graphical user interface configured to permit a user to select one or more of the predefined transducers and connect the selected transducers to portions of the model. The CAD environment further includes a simulation engine to run a simulation of the model. A graphical programming environment is configured to execute a graphical program embodied in a block diagram. The graphical program receives one or more simulated transducer signals from the CAD environment and generates and sends one or more control signals to the CAD environment, to control the simulation.

23 Claims, 9 Drawing Sheets

COMPUTER AIDED DESIGN ENVIRONMENT WITH ELECTRICAL AND ELECTRONIC FEATURES

BACKGROUND

1. Field of the Invention

The present disclosure is related generally to design and simulation of systems, and more specifically to design and simulation of electrical and/or electronic features in conjunction with computer aided design (CAD), graphical programming, and/or other environments.

2. Background Information

CAD environments are widely used by designers of mechanical systems, such as mechanical engineers and architects, to generate 2-D and 3-D models. In addition to modeling individual components, CAD environments are generally well suited for representing the layout and configuration of complex systems of components, as well as representing mechanical interactions between the components. Many CAD environments offer mechanical simulation features, including structural integrity simulation, multi-body dynamic motion simulation, materials fatigue simulation, fluid flow simulation, as well as other types of simulation. Some or all of these mechanical simulation features may be found in conventional CAD environments, such as AutoCAD® available from Autodesk, Inc. of San Rafael, Calif., SolidWorks®, available form SolidWorks Corporation of Concord, Mass. or CATIA®, available from Dassault Systems S.A. of Suresnes, France.

Graphical programming environments are often employed by designers of electrical and electronic systems, such as electrical engineers and computer scientists, to control, simulate, test, tune, and calibrate such systems. A graphical programming environment is one in which visual expressions, and the connections among visual expressions, are employed to specify and/or control program functions. Rather than entering text commands, visual expressions are selected and manipulated in an interactive manner, according to a program structure and grammar. Many graphical programming environments are structured according to a block diagram, where a set of icons, called blocks or node, are connected by lines, which typically represent signals. Blocks may represent any of a variety of functional entities, which perform mathematical operations, transformations, or both, on data. Signals represent data or may represent control connections among blocks.

One graphical programming environment that employs a block diagram is the LabVIEW® development system, available from National Instruments Corp. of Austin, Tex. In the LabVIEW® development system, a block diagram is constructed by selecting and connecting (i.e. "wiring up") icons using a block diagram editor. The block diagram embodies a graphical program that may perform any of a wide variety of functions. Where the graphical program performs instrumentation, measurement, or automation functions, the graphical program is often referred to as a virtual instrument (VI) or a sub VI.

A graphical program may further include a graphical user interface, commonly termed a front panel. A front panel typically has various graphical interface elements, such as controls or indicators, which represent or display inputs and outputs that are used by the graphical program, as well as icons representing devices being controlled. When a user places terminals or input/output blocks in the block diagram, corresponding front panel objects may be automatically created and displayed. Alternately, when controls or indicators are created in the front panel, corresponding icons, such as terminals, may be automatically created in the block diagram by the block diagram editor.

A graphical program may be executed in an interpretive process in the graphical programming environment. Alternately, a user may convert a graphical program to executable program code (for example, human-readable C, C++, or assembly code, or code generally not intended to be human-readable, for example binary code/binary libraries) that may be exported and executed beyond the graphical programming environment, for example on another computer. In still another alternative, a graphical program, or a portion thereof, may be converted to hardware description code, such as Very-High-Speed Integrated Circuit (VHSIC) Hardware Description Language (VHDL) code, that is compiled and used to program a Programmable Logic Device (PLD) or configure an Application-specific integrated circuit (ASIC) of an embedded system. One popular embedded system is the CompactRIO® control and data acquisition system available from National Instruments Corp. of Austin, Tex. The CompactRIO® system includes a real-time processor and a reconfigurable Field Programmable Gate Array (FPGA), and thus is capable of providing a wide variety of functions. Another popular embedded system is the RapidPro® control unit available from Dspace Inc. of Paderborn, Germany. The RapidPro® unit includes a microcontroller module and a variety of input/output (I/O) interfaces. When an embedded system is employed, a front panel may be remotely displayed on a computer system in communication with the embedded system.

While CAD environments and graphical programming environments have each existed for some time, they have generally inhabited quite different spaces in the engineering community. Mechanical engineers have generally operated CAD environment to design and simulate mechanical systems, while electrical engineers have generally utilized graphical programming environments to design and simulate electrical and electronic systems, and often only turned to CAD type tools for board layout and other similar work. Such a segregated approach has proven increasingly inefficient as mechanical and electronic systems become more tightly coupled. In many modern systems, mechanical design is becoming increasingly dependent on electrical and/or electronic operation of system components. Likewise design of electrical and/or electronic components is often closely linked to mechanical operation of systems. Yet, current design environment do not adequately address these issues.

SUMMARY

In an example embodiment, an electrical and electronic feature toolbox is created and provided in a CAD environment to add electrical and/or electronic design and simulation functionality to the environment. The toolbox permits a user to add electrical or electronic elements, such as transducers (e.g., actuators or sensors) to a model of a system, and then to simulate operation of the system, including operation of mechanical, electrical, and electronic elements, or to program an external embedded system to conduct a test using physical components.

In one configuration, the electrical and electronic feature toolbox includes a transducer library that defines a number of predefined transducers that a user may select and incorporate into a model of a system. The electrical and electronic feature toolbox may also include a routine library that defines a number of predefined operational routines, for use in controlling and/or interacting with selected transducers. Alternately, transducer control may be provided from a graphical programming environment, which communicates with the CAD environment. The graphical programming environment executes a graphical program embodied in a block diagram, which processes transducer signals received from the CAD environment, and generates control signals to be passed to the CAD environment. Further, the graphical programming environment may include a front panel, with user-adjustable controls (e.g. knobs, sliders, etc.), to allow a user to dynamically interact with a simulation.

When a simulation is in progress, a simulation engine of the CAD environment simulates the operation of the selected transducers under control of the selected routines and/or under control of the graphical program in the graphical programming environment. The simulation engine interoperates with a modeling engine of the CAD environment, to simulate interactions between the transducers and the mechanical aspects of the system. In this manner, the system is simulated in a unified manner, with both its mechanical and electrical and/or electronic aspects integrated into simulation results. The simulation results may be presented to a user within the CAD environment, or may be output to the graphical programming environment for display by indicators of the front panel.

In some configurations, the electrical and electronic feature toolbox includes a code generation engine that facilitates the programming of an embedded system. Depending on the particular type of embedded system to be programmed, the type and amount of code generated by the code generation engine may vary. For example, the code may include executable code, such as C-code, assembly language code, or other types of code for execution on a processor of the embedded system, as well as hardware configuration code for use in programming or otherwise configuring a programmable logic device (PLD), such as a Field Programmable Gate Array (FPGA), of the embedded system, if one is present. Once programmed, the embedded system may be used for any of a variety of functions, such as Hardware-In-the-Loop (HIL) simulation, Processor-In-the-Loop (PIL) simulation, Rapid Prototyping, data acquisition, test, measurement, or other functions. While conducting such functions, the embedded system may be able to communicate with the graphical programming environment, and be controlled with a front panel presented therein.

Further, in addition to programming an embedded system directly, the code generation engine in some implementations automatically generates a block diagram that describes the interactions between the selected transducers and routines. The block diagram is passed to the graphical programming environment, where a user may modify the block diagram, for example to optimize the graphical program embodied therein. In this manner, a mechanical engineer skilled in CAD environments may generate a basic block diagram within the CAD environment, and an electrical engineer or computer scientist, skilled in graphical programming environments, may modify the block diagram using the graphical programming environment.

BRIEF DESCRIPTION OF THE DRAWINGS

The description below refers to the accompanying drawings, of which.

DETAILED DESCRIPTION OF AN
ILLUSTRATIVE EMBODIMENT

Figure 1A:
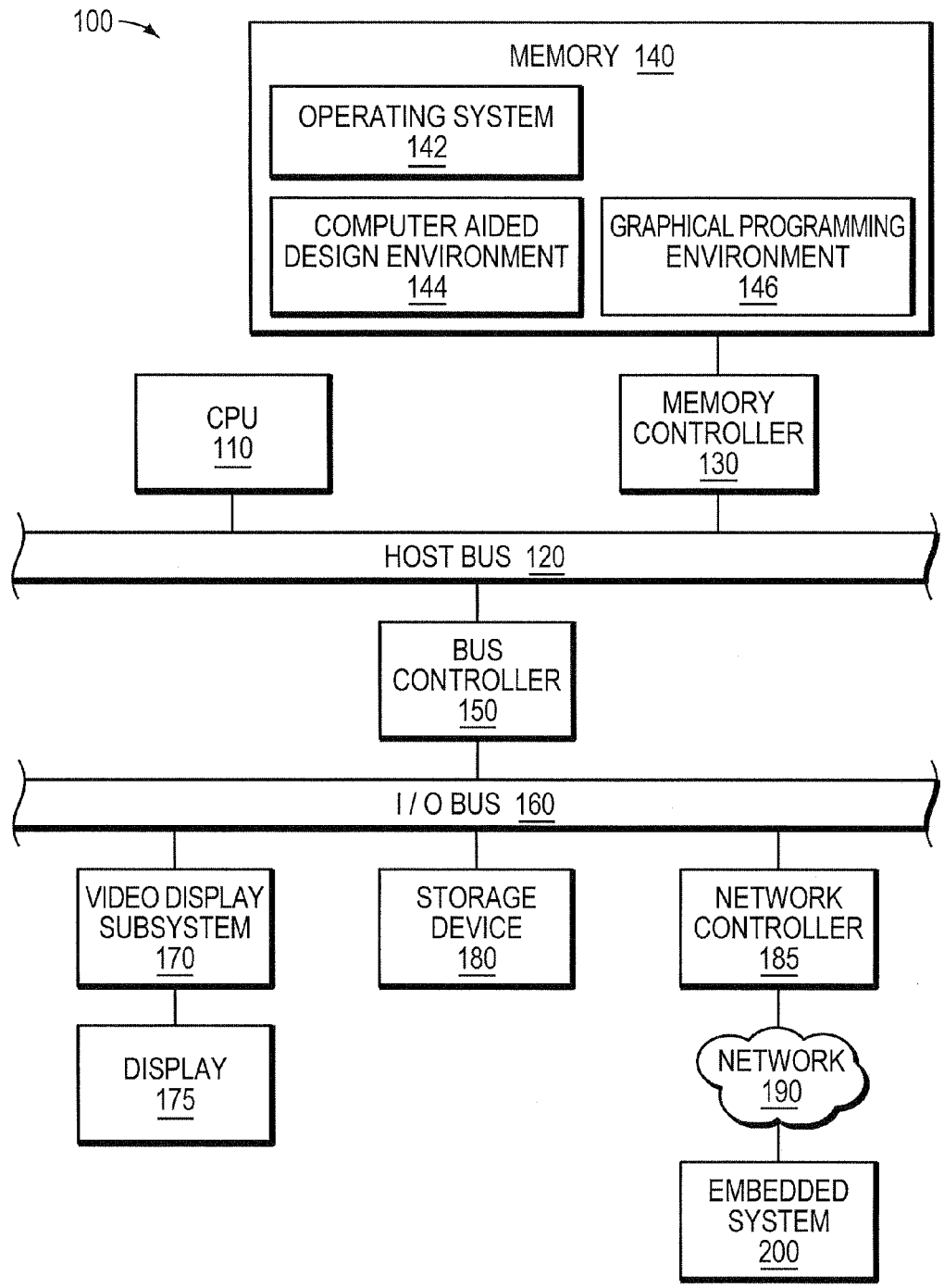
FIG. 1A is a schematic block diagram of an example computer system that may be used with some embodiments of the present disclosure.

FIG. 1A is a highly-schematic block diagram of a computer system 100. The computer system 100 includes at least one central processing unit (CPU) 110 coupled to a host bus 120. The CPU 110 may be any of a variety of commercially available processors, such as an Intel x86 processor, an Intel dual core processor, an IBM PowerPC processor, a Sun SPARC processor, or other type of processor. A memory 140, such as a Random Access Memory (RAM), is coupled to the host bus 120 via a memory controller 130. The memory 140 may be adapted to store at least a portion of an operating system 142 while the computer system 100 is operating. The memory 140 is further adapted to store certain application software executing on the computer system 100. The application software may include a Computer Aided Design (CAD) environment 144 that, in accordance with an embodiment of the present disclosure, implements electrical and/or electronic design and simulation features, as discussed further below. The application software may also include a graphical programming environment 146, such as LabVIEW® development system available from National Instruments Corp. of Austin, Tex. The graphical programming environment may be adapted to interact and exchange data with the CAD environment 144 and/or interact and exchange data with an embedded system or device, as discussed below.

While FIG. 1A shows the CAD environment 144 and the graphical programming environment 146 as separate pieces of application software, alternately such environments may be differing portions or logical divisions of the same piece of application software. Accordingly, it should be remembered that the techniques discussed herein are not limited to implementation with separate stand-alone software packages.

Further, as discussed in more detail below in relation to FIG. 1B, while the graphical programming environment 146 and the CAD environment 144 are depicted in FIG. 1A, as resident in the memory 146 and executed locally on CPU 110 of the computer system 100, this does not preclude alternate remote, networked, and/or distributed computing arrangements, including arrangements that make use of virtualized machines and/or operating systems.

Further, while the graphical programming environment 146 may be the LabVIEW® development system, any of a variety of other graphical programming environments may be alternately employed, such as the DASYLab® data acquisition system laboratory, and DiaDem® software package from National Instruments Corp. of Austin, Tex., Visual Designer™ available from Intelligent Instrumentation of Tucson, Ariz., Agilent VEE® available from Agilent Technologies Inc. of Santa Clara, Calif., Snap-Master™ available from HEM Data Corp. of Southfield, Mich., SoftWIRE® available from Measurement Computing Corp. of Norton, Mass., ObjectBench® available from Scientific and Engineering Software of Austin, Tex., the Simulink® technical programming environment available from The MathWorks, Inc. of Natick, Mass., WiT™ available from Dalsa Inc. of Waterloo, Ontario, Canada, Vision Program Manager™ available from PPT Vision, Inc. of Eden Prairie, Minn., the Modelica® language used with a number of commercial front-end interfaces, such as the Dymola® front-end available from Dassault Systems S.A. of Suresnes, France, and the Unified Modeling Language (UML) and the Systems Modeling Language (SysML) extension defined at the Object Management Group (OMG), among others.

The host bus 120 of the computer system 100 may also be coupled to an input/output (I/O) bus 160, such as a Peripheral Component Interconnect (PCI) bus, PCI Express Bus, Universal Serial Bus (USB) or other bus, through a bus controller 150, such as a Southbridge chip. The bus controller 150 may be configured to manage bus access and to implement functions such as interrupts, bus arbitration, and access channels. A video display subsystem 170, coupled to a display monitor 175, may be connected to the I/O bus 160. Similarly, a storage device 180, such as hard disk drive, a compact disk (CD) drive, Digital Video Disc (DVD) drive, Flash memory drive, or other type of device, may be coupled to the I/O bus 160. The storage device 180 is adapted to persistently store data, so that it may be loaded to the volatile memory 140 when needed. For example the operating system 142, CAD environment 144, and/or graphical programming environment 180 may be stored at storage device 180 until needed.

The I/O bus 160 may further be coupled to network controller 185 that interfaces with a network 190. The network 190 allows communication between the computer system 100 and other computer systems (not shown) using any of a number of well known network protocols, such as the Transmission Control Protocol (TCP) and/or User Datagram Protocol (UDP). The network 190 may be a wired network, a wireless network, a combination of wired and wireless, or another type of network.

In the illustrative embodiment, the network 190 allows communication between the computer system 100 and an embedded system 200. Such communication may include programming of the embedded system 200, as well as data exchange with an already programmed embedded system. In some configurations, the embedded system 200 may be a CompactRIO® industrial control and data acquisition system, available from National Instruments Corp. of Austin, Tex. However, it is expressly contemplated that other types of embedded systems adapted for test, measurement, simulation, and/or other functions, may be employed. For example, embedded systems based upon the C6000™ or the C2000™ Digital Signal Processing (DSP) chips, available from Texas Instruments of Dallas, Tex. or embedded systems based upon the C166® microcontroller, available from Infineon Technologies, of Munich, Germany, may alternately or additionally be used.

In addition, the network 190 may permit remote, networked, and/or distributed computing arrangements. Such arrangements may make use of network 190 to allow some or all of the functionality graphical programming environment 146 and/or the CAD environment 144 to be provided by other systems. In some configurations, a portion of the environments may still be resident in the memory 140 of the computer system 100. Yet, in other configurations, the environments may not be present in the memory 140 the computer system 100, and the computer system 100 may simply interface with environments resident on a remote system.

Figure 1B:
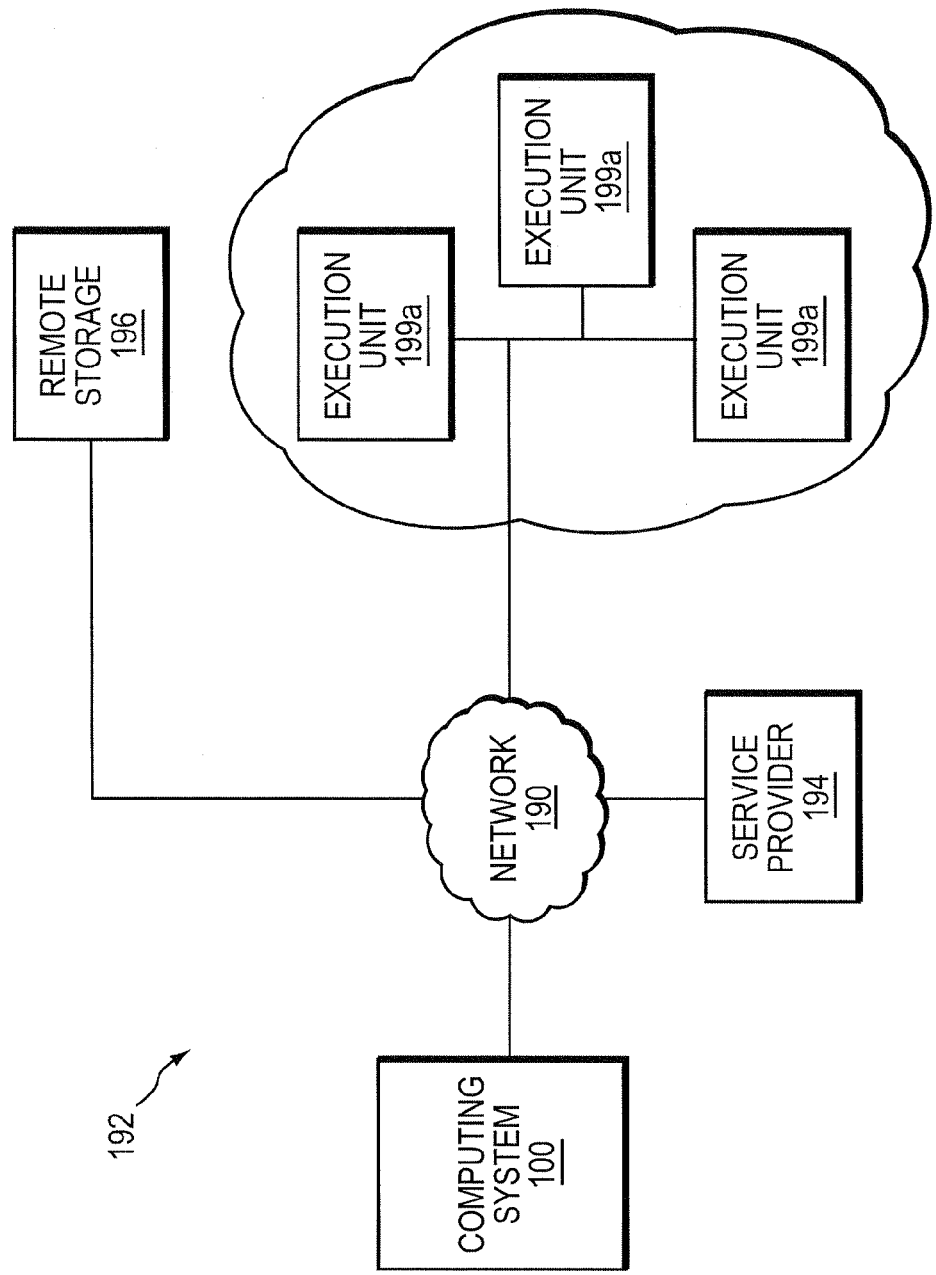
FIG. 1B is a schematic block diagram of an example computer network that illustrates a number of remote, networked, and/or distributed computing arrangements that may be used with some embodiments of the present disclosure.

FIG. 1B is a schematic block diagram of a computer network 192 that illustrates a number of example remote, networked, and/or distributed computing arrangements. In one configuration, computer system 100 may communicate via network 190 with a service provider 194. A service provider 194 is an entity, such as an individual, a corporation, an educational institution, a government agency, or another type of organization that operates computing systems, such as servers, which may offer functionality to the computer system 100. For example, the service provider 194 may pass computer executable instructions to the computer system 100 that when executed by the computer system 100 perform a particular desired operation. Alternately, the service provider 194 may execute certain computer executable instructions on behalf of the computer system 100, and may pass computation result, display information, and/or other types of data back to the computer system 194.

In some embodiments, the service provider 194 may operate one or more webservers configured to accept Hypertext Transfer Protocol (HTTP) and/or other types of requests from a web browser or other application of the computer system 100. A user of the computer system 100 may subscribe to a web-based service provided by the service provider 194, for example via a monthly subscription, a per-use subscription, a data volume based subscription, a computational load based subscription, or another type of subscription. Thereafter, the user may access functionality on a computer system of the service provider 194.

In another configuration, a remote storage system 196 may be provided that includes, for example, a Redundant Array of Independent Disks (RAID), an individual hard-disk drive, one or more solid-state storage devices, and/or other types of storage devices. The remote storage system 196 may store information related to a collaborative project, for example a government or industry sponsored research or design project. Such information may include specifications, test data, program code, or other types of information. A user of the computer system 100 may obtain the information from the remote storage system 196, use, add to, or otherwise manipulate the information, and then transfer information back to the remote storage system 196, for storage and possible use by others working on the project.

In another configuration, a cluster 198 of remote execution units 199a, 199b, 199c may be provided to perform remote processing on behalf of the computer system 100. The computer system 100 may offload certain computation tasks to one or more of the remote execution units 199a, 199b, 199c, which perform the tasks and return results to the computer system 100. In this manner, additional computational resources beyond those of the computer system 100 may be enlisted when needed.

Figure 2:
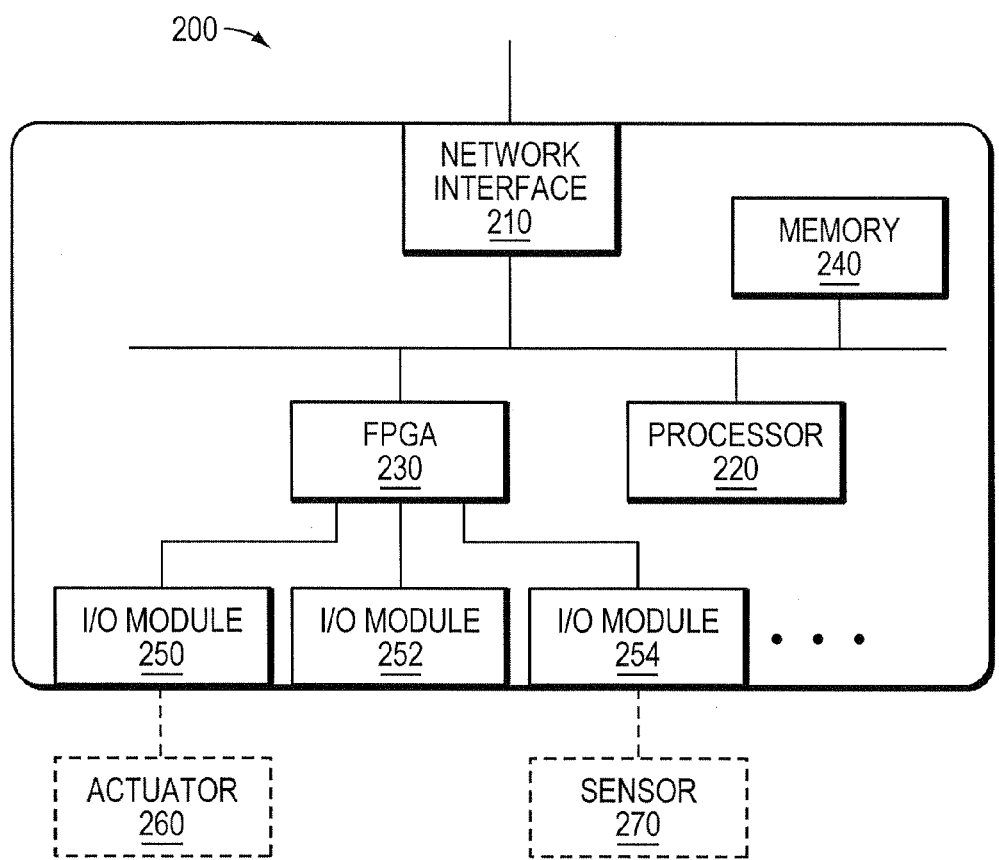
FIG. 2 is a block diagram of an example embedded system that may be employed with the computer system of FIG. 1A.

FIG. 2 is a block diagram of an example embedded system 200 that may be employed with the computer system 100. The example embedded system 200 includes a network interface 210, such as an Ethernet port, Universal Serial Bus (USB) port, Parallel port, or other type of interface, coupled to a processor 220, for example a single core processor or multi-core processor. Optionally, the network interface 210 may also be coupled to a programmable logic device (PLD), such as a reconfigurable Field Programmable Gate Array (FPGA) 230, or to another type of reconfigurable device.

The FPGA 230 may be capable of parallel, real-time processing, and/or parallel switching functions. A memory 240 may be coupled to the processor 220 and the FPGA 230. Further, the FPGA 230 (or the processor 220 itself) may be coupled to one or more I/O modules 250, 252, 254 for communication to external transducers. A transducer is a device that receives a signal in the form of one type of energy flow and converts it to a signal in another form. For example, a transducer may be an actuator 260, such as a motor, solenoid etc., which manipulates the physical environment or a sensor 270, such as a proximity sensors, accelerometer, force sensor, etc., which detects a change in the environment. Further, the term transducer may refer to an entire device, including any signal conditioning circuitry, measurement circuitry, digitalization circuitry and/or other types of circuitry that may be included in the device, in addition to the circuitry of the device that performs that actual conversion between one power domain and another.

Communication with external transducers may be used to control such transducers and/or receive data from the transducers. Each I/O module 250, 252, 254 includes built-in connectivity circuitry, signal conditioning circuitry, conversion circuitry (for example, Analog to Digital Conversion (ADC) or Digital to Analog Conversion (DAC) circuitry), up/down conversion circuitry, and/or isolation barriers, to simplify communication with external transducers.

As discussed in more detail below, the embedded system 200 may be configured to execute at least a portion of a graphical program embodied in a block diagram. In one configuration, at least a portion of the graphical program is compiled to program code, such as C-code, C++ code, assembly code, binary code, or another type of code, and then transferred to the embedded system 200 where it is executed, for example under a real time operating system (RTOS), on the processor 220. Further, in some embodiments, at least a portion of the graphical program is converted into hardware description code, such as VHDL code, that is compiled and used to program the FPGA 230 of the embedded system 200. The compilation process may include converting the hardware description into a FPGA-specific netlist with a synthesis tool, and then generating a hardware configuration program there from. The hardware configuration program is then employed to program the FPGA 230. Further discussion relating to the programming and use of the embedded system 200 may be found in U.S. Pat. No. 6,823,283 to Steger et al., entitled Measurement System Including a Programmable Hardware Element and Measurement Modules that Convey Interface Information, which is representative of the techniques known in the art.

Once programmed, the embedded system 200 may interact with the transducers to perform a variety of functions. Depending on the specific graphical program used, the embedded system 200 may perform Hardware-In-the-Loop (HIL) simulation, Processor-In-the-Loop (PIL) simulation, data acquisition, test, measurement, as well as a variety of other functions.

Figure 3:
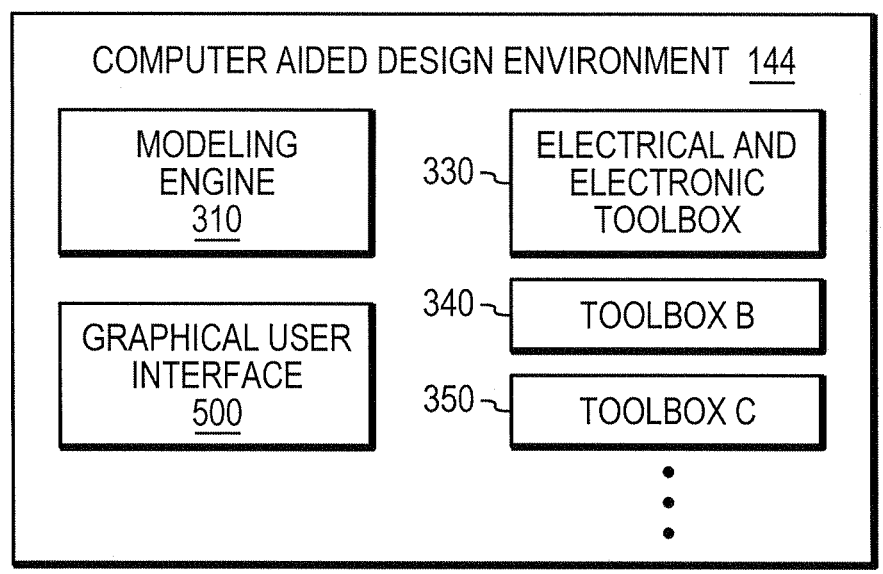
FIG. 3 is a block diagram of an example CAD environment adapted for design and/or simulation of electrical and/or electronic features.

The computer system 100 and/or the embedded system 200 may be employed to advantage with the techniques discussed below. FIG. 3 is a block diagram of an example CAD environment 144 that is adapted for design and/or simulation of electrical and/or electronic features, according to one embodiment of the present disclosure. The CAD environment 144 may include a number of well known CAD functions as understood by one skilled in the relevant art. For brevity, only a few of the well understood aspects of the CAD environment 144 are touched upon herein. An extended discussion of the many features common to CAD environments may be found in U.S. Pat. No. 5,815,154 to Hirschtick, et al., entitled Graphical Browser System for Displaying and Manipulating a Computer Model, and in U.S. Pat. No. 6,184,901 to Silva, et al., entitled Three Dimensional Modeling and Animation System, both of which are representative of the techniques known in the art.

The CAD environment 144 includes a modeling engine 310 adapted for creating and maintaining models of systems. A graphical user interface 500 interoperates with the modeling engine 310 to permit a user to build, modify, view, and/or simulate a model. A number of toolboxes 340, 350 may also be included in the CAD environment 144, to provide additional functionality, on top of the basic functions of the modeling engine 310. In accordance with the illustrative embodiment, a novel electrical and electronic feature toolbox 330 may be provided, as discussed in more detail below.

Figure 4A:
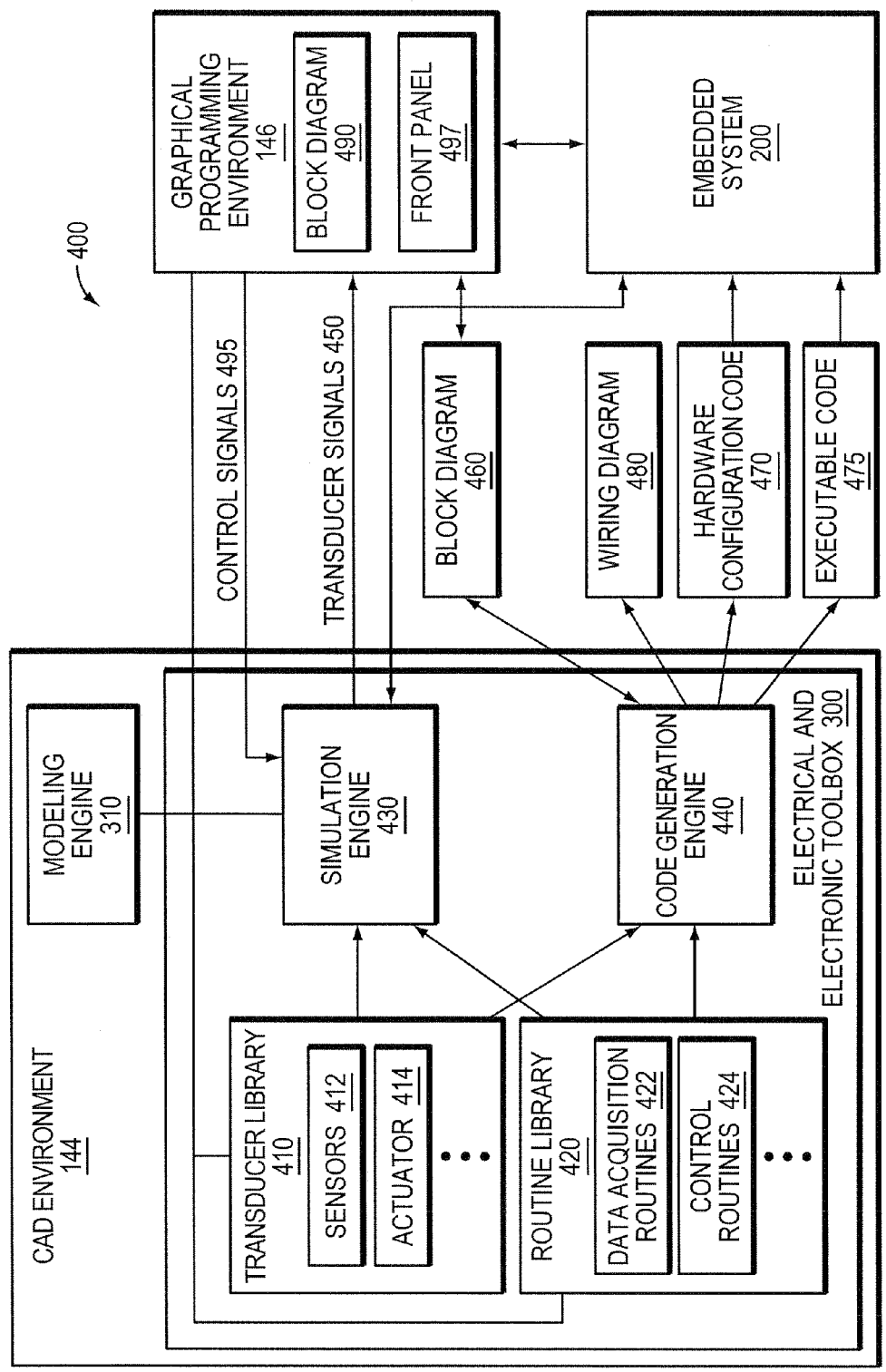
FIG. 4A is a highly schematic block diagram showing an expanded view of an example electrical and electronic feature toolbox, as well as its interactions with external environments and devices, for example the above described graphical programming environment and the above described embedded system.

FIG. 4A is a highly schematic block diagram 400 showing an expanded view of an example electrical and electronic feature toolbox 330, as well as its interactions with external environments and devices, such as the above described graphical programming environment 146, and the above described embedded system 200. The electrical and electronic feature toolbox 330 includes a transducer library 410 that defines a number of predefined transducers that a user may incorporate into (i.e. place and/or couple to structures of) a mechanical model in the CAD environment. The transducer library generally includes a wide variety predefined transducers that may be organized into a plurality of palettes to facilitate their selection and use. For example, a sensors palette 412 may include a number of predefined sensors, such as proximity sensors (e.g. hall effect, ultrasonic, reed, etc.), position sensors (e.g. optical, linear variable differential, etc), accelerometers, force sensors, as well as other types of sensors. Similarly, an actuators palette 414 may include a number of predefined actuators, such as rotary motors, linear motors, solenoids, valves, as well as other types of actuators. In one embodiment, at least some of the sensors in the sensor palette 412 are preconfigured to correspond to certain commercially available physical sensors, and at least some of the actuators in the actuator palette 414 are preconfigured to correspond to certain commercially available physical actuators.

Further, many of the predefined transducers may have a number of user-configurable parameter, which are settable by a user through a menu, property page, dialog, application program interface (API), wizard system, etc. For example, if a generic motor is selected from the transducer library 410, parameters such as viscous friction, shaft inertia, motor constant, armature inductance, and armature resistance may be entered by a user to cause the motor to simulate a particular commercially available physical motor. In this manner, the predefined transducers may be adapted to approximate particular physical components, suitable for use in a physical system.

In addition to selecting predefined transducers, a user may also create custom transducers and add them to the predefined transducer library 410. Custom transducers may be programmed using a high-level programming language, such as C or Java, and imported into the transducer library 410. Alternately, custom transducers may be programmed in a graphical programming environment 146, and then imported for inclusion in the transducer library 410. In this manner, a great deal of flexibility may be provided to accommodate non-standard types of transducers.

The electrical and electronic feature toolbox 330 also includes a routine library 420 that defines a number of predefined operational routines for use in controlling and/or interacting with the transducers of the transducer library 410. As with the transducer library, the routine library 420 is organized into a plurality of palettes. For example, a data acquisition (DAQ) routine palette 422 may include a number of predefined routines for reading data from sensors. Likewise, a control routine palette 424 may include a number of predefined control routines for controlling actuators. A wide variety of other palettes of predefined routines may be provided to permit various types of operation and responses. Further, each routine may be modified for use in a variety of different situations with different systems. Such modification may include selection of various parameters, optional steps, and/or other features through a menu, text-window, dialog, API, or wizard interface.

Further, in addition to predefined routines, a user may also create custom routines and add them to the predefined routine library 420. Custom routines may be programmed using a high-level programming language, such as C or Java, and imported into the routine library 420. Alternately, routines may be programmed in the graphical programming environment 146 and then translated as necessary for inclusion in the routine library 420.

In yet another alternative, the routine library 420 may be entirely absent, and instead, transducer control may be provided from the graphical programming environment 146. In such a configuration, a graphical program embodied in a block diagram 490, executing in the graphical programming environment 146, generates control signals 495. The control signals 495 include sensor control signals and/or actuator control signals depending on the particular implementation. Some control signals may be generated in a predetermined manner by functional units hard-coded into the block diagram 490, while other control signals may be responsive to user-adjustable controls (e.g., knobs, sliders, etc.) displayed in a front panel 497 of the graphical programming environment 146. In this manner, the functionality of the graphical programming environment 146 may be leveraged to interaction with transducers in the CAD environment 144.

In some configurations, a simulation engine 430 of toolbox 330 simulates the operation of the selected transducers from the transducer library 410, under the control of the selected routines from the routine library 420, and/or control signals from the graphical programming environment 146. The simulation engine 430 interoperates with the modeling engine 310 of the CAD environment 144, to simulate interactions between the transducers and the mechanical aspects of a system. For example, movement caused by a motor may propagate through various mechanical joints and linkages in a mechanical model, causing various degrees of movement therein. At some later point, a proximity sensor may detect some resulting movement of a component. The simulation engine 430, in conjunction with the modeling engine 310, considers the potentially complex mechanical interactions, and generates the appropriate simulation results in response thereto. For example, simulated proximity sensor readings may be generated.

The simulation results may be presented to a user via the graphical user interface 500 (FIG. 3) of the CAD environment 144. Alternately, in some configurations, the simulated results may be output to the graphical programming environment 146 via transducer signals 450. The transducer signals 450 are interpreted by the graphical program executing in the graphical programming environment 146, and displayed to a user on indicators (e.g., gauges, readouts, graphs, etc.) of the front panel 497. In addition, the transducer signals 450 may be used by the graphical program to generate a new set of control signals 495 to provide responsive control.

In addition to simulation of a transducers incorporated into a model in the CAD environment 144, the electrical and electronic feature toolbox 330 may be used to program an embedded system 200. In this manner, a physical test system may be rapidly created, for example to permit HIL or PIL simulation. A code generation engine 440 of the electrical and electronic feature toolbox 330 uses selected transducers from the transducer library 410, selected routines from the routine library 420, and/or other information from other sources, to generate code to program the embedded system 200. The generated code implements the selected routines and facilitates communication with physical transducers corresponding to those selected in the transducer library. Depending on the particular type of embedded system 200 employed, the type and amount of code generated by the file generation engine 440 may vary. For example, in an implementation where the embedded system 200 contains both a processor 220 and an FPGA 230, such as where the embedded system is a CompactRIO® industrial control and data acquisition system, separate code may be generated for use with the respective devices. Executable code 475, including, for example, C-code, C++ code, assembly language code, and/or binary code may be generated and executed by a RTOS of the processor 220 (FIG. 2). Also, hardware configuration code 470 may be generated and used to program the FPGA 230.

Further, in addition to programming the embedded system 200 directly, the code generation engine 440, in some implementations, automatically generates a block diagram 460 that describes the interactions between selected transducers and routines using graphical programming constructs. The block diagram 460 is passed to the graphical programming environment 146, where a user may display, inspect, and, if desired, modify the block diagram, for example to optimize the graphical program embodied therein. In this manner, a mechanical engineer skilled in CAD environments may utilize the CAD environment 144 to generate a basic block diagram 460 that describes the operation of a system. Later, an electrical engineer or computer scientist, skilled in graphical programming environments, may modify the block diagram 460 using the graphical programming environment 146, for example, to optimize, add features, or otherwise enhance the graphical program. The modified block diagram may later be used to program the embedded system 200 directly from the graphical programming environment 146, using conventional techniques, or may be transferred back into the CAD environment 144, and used to program the embedded system 200 therefrom.

In some configurations, to assist a user in connecting (i.e. wiring) the embedded system to physical transducers, power supplies, and other devices, a wiring diagram 480 is generated by the code generation engine 440. Such a wiring diagram may be particularly useful to users who lack in-depth familiarity with the embedded system 200, and its electrical connection scheme.

An example wiring diagram 480 may be generated by the code generator 440 for one particular arrangement of physical transducers, power supplies, and/or other devices. Such a diagram may guide a user in a step-by-step manner through needed wiring connections. In this manner, the techniques disclosed herein may be made more accessible to a wider base of users.

Figure 5:
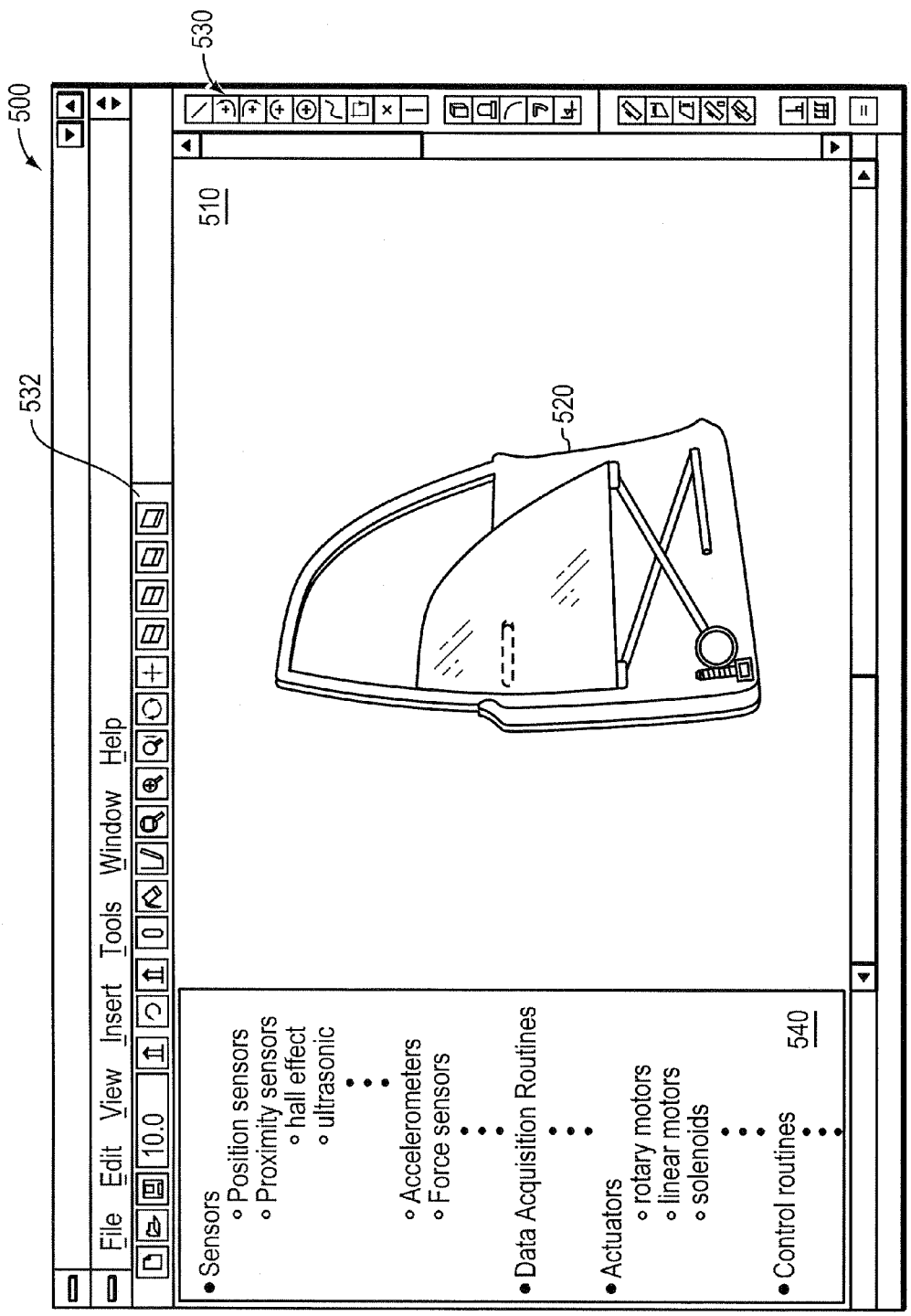
FIG. 5 is a diagram of an example graphical user interface of the example CAD environment of FIG. 3.

FIG. 5 is a diagram of an example graphical user interface (GUI) of the CAD environment of FIG. 3. The GUI includes several portions. A modeling portion 510 is adapted to display a model 520 that is constructed and modified by a user. For example the user may construct, a car door having a powered window as shown in FIG. 5, as one possible example of a type of structure that could be modeled. It should be remembered that a wide variety of systems may be modeled, including quite complex and large systems, such as an entire manufacturing assembly line, a robotic arm that can move along multiples axes, etc. The GUI also includes one or more tools palettes 530, 532 that provide drawing tools, manipulation tools, animation tools, simulation tools and/or other functions to a user. An electrical and electronic feature toolbox interface 540 allows a user to access the functionality of the electrical and electronic feature toolbox 330. The interface 540 displays a plurality of transducers from the transducer library 410, and a plurality of routines from the routine library 420, as well as other features from any other libraries or units that may be provided. A variety of menus, radio-buttons, and other well known GUI structures may be employed to permit selection and manipulation of the displayed transducers and/or routines. Once selected, the transducers, routines, and other features are placed and connected to portions of the model by the user.

Figure 6:
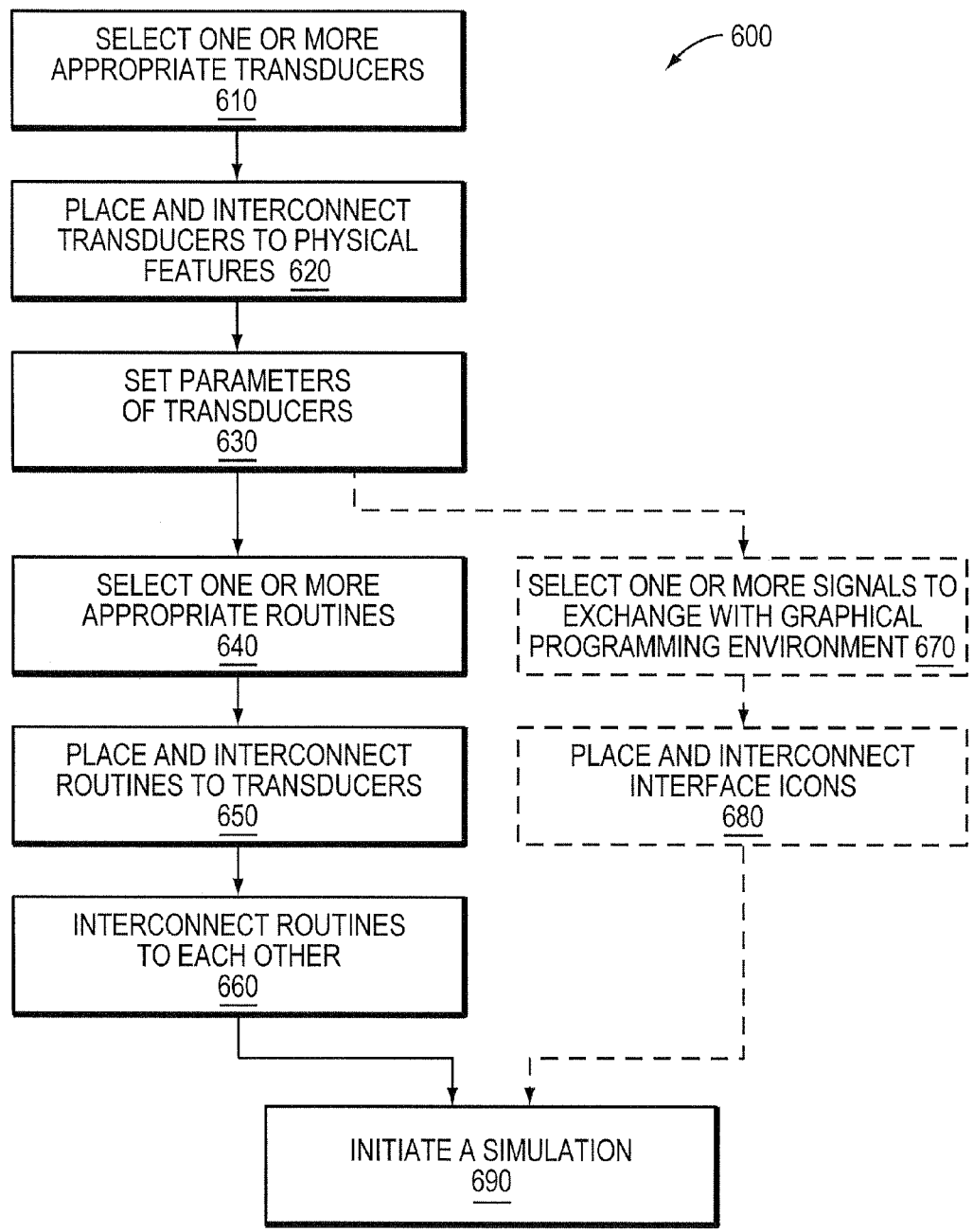
FIG. 6 is a flow diagram of an example sequence of steps that may be employed to add electrical and electronic features to a mechanical model, and conduct a simulation.
Figure 7:
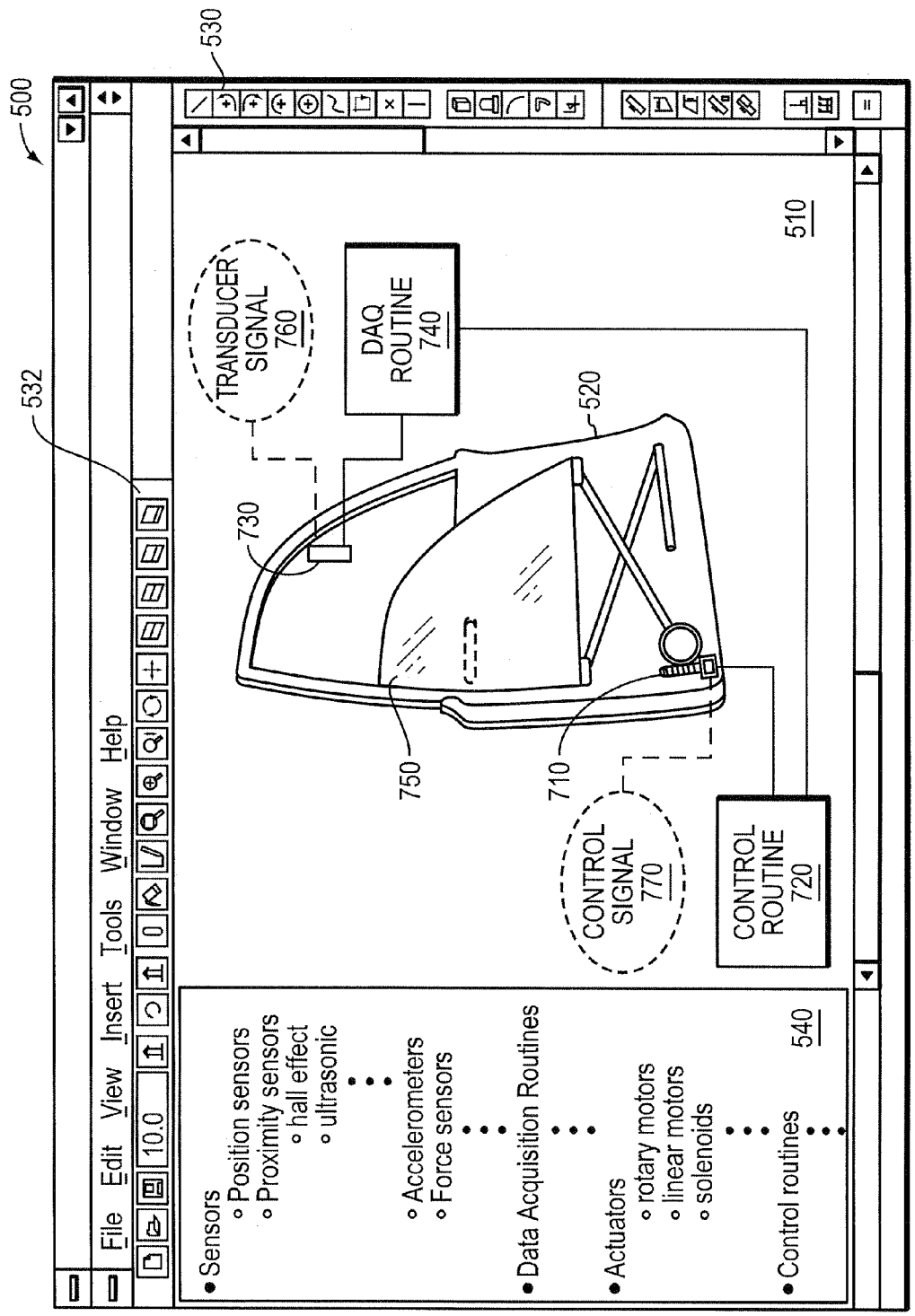
FIG. 7 is a diagram of the example graphical user interface of FIG. 5, showing the placement and connection of example transducers and routines.

FIG. 6 is a flow diagram of an example sequence of steps that may be employed to add electrical and electronic features to a model, and to conduct a simulation of the completed model. In discussing FIG. 6, reference will be repeatedly made to FIG. 7, which shows the placement and connection of example transducers and routines in the GUI of FIG. 5. Accordingly, the reader is encouraged to refer to both figures in considering the discussion below.

At step 610, a user of the CAD environment 144 selects one or more appropriate transducers from the interface 540 for use in the model 520. For example, a motor 710 may be selected to operate the window 750 of the car door model 520 during evaluation of the car door model 520, and possibly also during testing of a physical mock-up. Similarly, a Hall Effect proximity sensor 730 may be selected for detecting the movement of the window 750. At step 620, the transducers are placed at appropriate locations in the model 520, and connected with mechanical features of the model. Such connection may involve connecting the transducers via a line or other representation to the mechanical features, and entering, for example via a dialog box or other interface, an indication of the exact mechanical quantity being connected to, if the transducer may be connected to several portions of the mechanical feature. To aid the user, a context-dependent list of mechanical quantities may be displayed in the dialog box or other interface, such that the user may select from only those mechanical quantities appropriate for the type of transducer being used. Further, if only a single mechanical quantity is appropriate for the transducer, it may be automatically selected.

At step 630, parameters of the transducers are set and adjusted. For example, a pop-up menu (not shown), may allow the user to modify the characteristics of the motor 710 and Hall Effect proximity sensor 730, to approximate counterpart physical devices that are envisioned to be used with an actual car door.

At step 640, a user selects operational routines from the interface 540 for use in controlling and/or interacting with the transducers. For example, a particular motor control routine 720 may be selected that is suited for a simulating window up/down inputs from a driver or passenger of the car. Similarly, a DAQ routine 740 may be selected that is appropriate for processing, responding to, and/or displaying signals generated by the Hall Effect proximity sensor 730 during testing of a mock-up of the car door. At step 650, the user places the routines in the modeling portion 510 of the GUI, and connects (e.g., "wires") them to the appropriate transducers. For example, the control routine 720 is connected to the motor 710, and the DAQ routine 740 is connected to the Hall Effect proximity sensor 730. Further, at step 660, the routines may be connected to each other if responsive and/or dynamic control is desired. For example, a signal from the DAQ routine 740 may be fed back to the control routine 720 and be used to control the motor 710 in response to window position.

Alternately, as discussed above, rather than employ predefined operation routines in the CAD environment itself, the transducers may be connected and caused to operate under the direction of a graphical program executed by the graphical programming environment 146. At alternative step 670, a user may select appropriate control signals and transducer signals to be exchanged with the graphical programming environment 146. Such signals may be graphically represented by interface icons, such as a transducer signal interface icon 760 and a control signal interface icon 770. At alternative step 680, the user places the icons 760, 770 in the modeling portion 510 of the GUI, and connects them with the transducers as appropriate.

Finally, at step 690, the user may initiate a simulation. The simulation may be conducted in a single simulation loop, or in multiple simulation loops. Multiple simulation loops may be executed concurrently in separate threads, tasks, processes, or other forms of execution. Alternately, multiple simulation loops may be executed in a manner that mimics concurrent execution, while not being truly concurrent. For example, two or more simulation loops may be executed in an interleaved manner to share resources, such as a thread. Depending on the particular implementation, a user may control the simulation through the CAD environment 144, a front panel 497 of the graphical programming environment 146, or in another manner. For example, a user may separately control different simulations loops, to start, stop, pause or otherwise manipulate the loops. Further, a user may choose differing simulation and/or configuration settings for each simulation loop. For example, a user may designate that one simulation loop should be executed by a variable step solver, which implements implicit or explicit numerical integration schemes, and designate that another simulation loop should be executed using a fixed step solver based on, for example, an explicit numerical integration scheme.

Depending on the particular implementation, simulated results may be presented to a user in the CAD environment 144, displayed to a user in a front panel 497 of the graphical programming environment 146, stored, exported to an external device, and/or otherwise used. As described above, the user may interact with the simulation to test various scenarios and responses.

Figure 8:
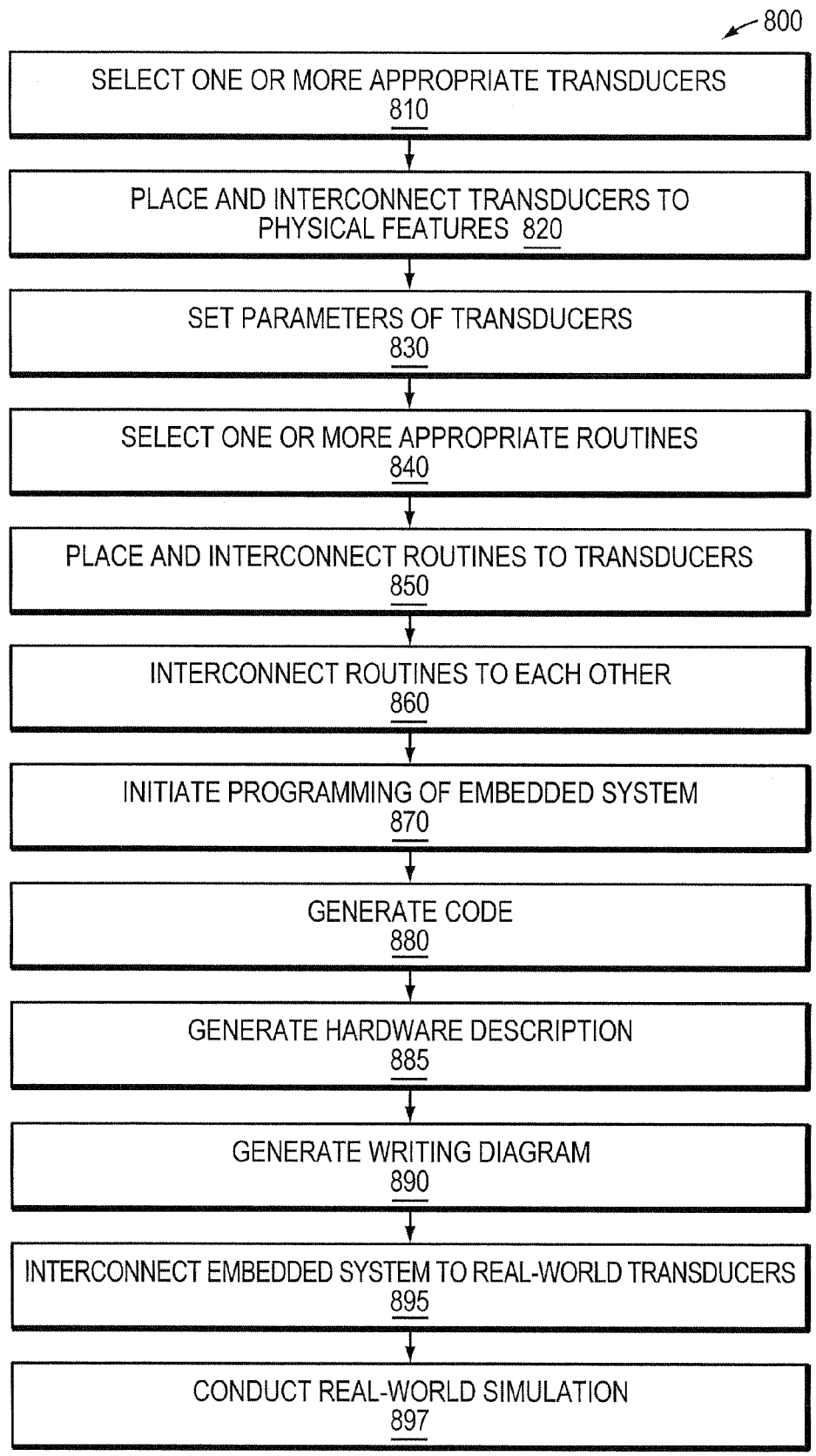
FIG. 8 is a flow diagram of an example sequence of steps that may be employed to program an embedded system to interoperate with physical transducers and other devices.

FIG. 8 is a flow diagram of an example sequence of steps that may be employed to program an embedded system 200 to interoperate with physical transducers and other devices. Steps 810-860 detail how a user may place transducers and routines in a model in the CAD environment 144 and parallel steps 610-660 discussed above in relation to FIG. 6. Accordingly, rather than repeat such discussion, the reader is referred to the corresponding discussion above for more detail.

At step 870, the user initiates programming of an embedded system, such as a CompactRIO® industrial control and data acquisition system. At step 880, the code generation engine 440 may generate executable code, such as a C-code, assembly language code, etc., for execution on a processor 220 of the embedded system 200. Depending on the type of embedded system employed, the code generation engine 440 may also, at step 885, generate hardware configuration code 470. As discussed above, the hardware configuration code 470 may include information necessary to program or otherwise configure a PLD, such as a FPGA, to perform various functions in hardware. At step 890, a wiring diagram 480 may be also generated by the code generation engine 440. At step 895, the embedded system is connected, according to the wiring diagram, to physical transducers attached to a physical system, for example an electric motor and a Hall Effect sensor attached to an actual car door. Finally, at step 897, the configured embedded system 200 may be used to conduct a HIL simulation or PIL simulation. During such simulation, the embedded system 200 may communicate with the simulation engine 430 of the CAD environment to display results and accept control input. Alternately, the embedded system may communicate with the graphical programming environment 146 and display and accept control from the front panel 497. In yet another alternative, the embedded system may operate completely autonomously.

The foregoing has been a detailed description of several embodiments of the present disclosure. Further modifications and additions may be made without departing from the disclosure's intended spirit and scope.

For example, certain of the above features described as internal to the CAD environment 144 may be instead provided by software external to the CAD environment. For example, a user may create a model in the CAD environment 144 and then export the model to the graphical programming environment 146, which in an alternate configuration, may include its own simulation engine, similar to simulation engine 430.

Likewise, in another example configuration, a user may create a model in the CAD environment 144 and then export the model to a special purpose modeling and simulation environment (not shown), such as the SimMechanics toolset which extends the Simulink® technical programming environment, both of which are available from The Mathworks, Inc. of Natick, Mass. Once in the modeling and simulation environment, transducers may be added to the model and both the electrical and mechanical aspects of the system simulated. Transducer and control signals may be exchanged between the modeling and simulation environment and the graphical programming environment 146 in conducting the simulation. In this manner, the use of the CAD environment 144 may be limited to the mechanical design of the system, and other software packages may implement many of the features discussed above.

In addition, while the above description discusses that simulated transducer signals may be displayed to a user on indicators (e.g., gauges, readouts, graphs, etc.) of a front panel 497 of the graphical programming environment 146, such signals may be displayed in a variety of other manners. For example, a timing diagram may be automatically generated by the simulation engine 430 that includes indications of the values of various signals at different points in time.

Also while the above description discusses that a user may select a number of user-configurable parameter of a transducer, via a menu, property page, dialog, application program interface (API), wizard system, etc., to approximate particular physical components, such processes may also be automated. For example, a user may simply select a name of a particular transducer and a variety of parameters may automatically be retrieved from a local database, from a remote database accessible via a network connection, or from other type of data repository.

Further, the reader is reminded that many of the above techniques may be implemented in hardware (for example in programmable logic circuits, specially-designed hardware chips, analog or partially-analog devices, and other types of devices), in software (for example in applications having computer-executable instructions stored on computer-readable media for execution on a computing device), or in a combination of hardware and software. Accordingly, it should be remembered that the above descriptions are meant to be taken only by way of example, and not restricted to a particular implementation mode.

What is claimed is:

1. An apparatus for modeling a physical system, the apparatus comprising:
    a Computer Aided Design (CAD) environment configured to create a CAD model of the physical system, the CAD model having an arrangement of computer-displayed structural objects dimensionally representing geometric characteristics of the physical system, the CAD environment including a transducer library having a plurality of predefined transducers, and a graphical user interface configured to permit a user to
        select one or more of the predefined transducers from the transducer library,
        add the one or more selected transducers to the CAD model, and
        connect the one or more selected transducers to one or more of the computer-displayed structural objects of the CAD model;
    a simulation engine configured to run a simulation of the CAD model having the one or more selected transducers to produce one or more transducer signals;
    a graphical programming environment in communicating relationship with the CAD environment, the graphical programming environment configured to execute a graphical program, the graphical program configured to receive the one or more transducer signals, and to generate and send one or more control signals to the CAD environment to control the CAD model,
    wherein the CAD environment is further configured to display the CAD model.

2. The apparatus of claim 1, wherein the graphical programming environment is further configured to generate a timing diagram including indications of values of the one or more transducer signals at various points in time.

3. The apparatus of claim 1, wherein the plurality of predefined transducers includes one or more sensors or one or more actuators.

4. The apparatus of claim 1, wherein the graphical programming environment further includes a front panel with one or more user-adjustable controls configured to interact with at least a portion of the CAD model or the CAD environment.

5. The apparatus of claim 1, wherein the graphical program generates the one or more control signals dynamically in response to the one or more transducer signals.

6. The apparatus of claim 1, wherein the CAD environment further includes a plurality of predefined operational routines, and the graphical user interface is configured to permit a user to select one or more of the predefined operational routines and to connect the one or more selected operational routines to the one or more selected transducers.

7. The apparatus of claim 1, wherein a predefined transducer has at least one user-configurable parameter whose value adapts the predefined transducer to approximate a particular physical transducer.

8. The apparatus of claim 1, wherein the graphical program is embodied in a block diagram.

9. A method for modeling a physical system, the method comprising:
creating a CAD model of the physical system in a Computer Aided Design (CAD) environment, the CAD model having an arrangement of computer-displayed structural objects dimensionally representing geometric characteristics of the physical system;
selecting one or more predefined transducers for use in the CAD model;
adding the one or more selected transducers to the CAD model;
connecting the one or more selected transducers to portions of the CAD model;
simulating the CAD model having the one or more selected transducers by a simulation engine to produce one or more transducer signals;
executing a graphical program in a graphical programming environment, the graphical program receiving the one or more transducer signals and generating and sending one or more control signals to the CAD environment to control the CAD model of the physical system; and
displaying the CAD model.

10. The method of claim 9 further comprising:
displaying a timing diagram that includes indications of the values of the one or more transducer signals at various points in time.

11. The method of claim 9, wherein the plurality of predefined transducers includes one or more sensors or one or more actuators.

12. The method of claim 9, further comprising:
adjusting one or more user-adjustable controls of a front panel of the graphical programming environment to interact with at least part of the CAD model or the CAD environment.

13. The method of claim 9, wherein generating the one or more control signals is in response to the one or more transducer signals.

14. The method of claim 9, further comprising:
setting at least one user-configurable parameter of a predefined transducer with a value that adapts the predefined transducer to approximate a particular physical transducer.

15. The method of claim 9, wherein the graphical program is embodied in a block diagram.

16. A non-transitory computer-readable storage media comprising instructions for modeling a physical system, the instructions, when executed by a computer, are operable to:
create a CAD model of the physical system in a Computer Aided Design (CAD) environment, the CAD model having an arrangement of computer-displayed structural objects dimensionally representing geometric characteristics of the physical system;
select one or more predefined transducers for use in the CAD model;
add the one or more selected transducers to the CAD model
connect the one or more selected transducers to portions of the CAD model;
simulate the CAD model having the one or more selected transducers to produce one or more transducer signals;
execute a graphical program in a graphical programming environment, the graphical program receiving the one or more transducer signals and generate and send one or more control signals to the CAD environment to control the model of the physical system; and
display the CAD model.

17. The non-transitory computer-readable storage media of claim 16, wherein the instructions, when executed, are further operable to:
display a timing diagram that includes indications of the values of the one or more transducer signals at various points in time.

18. The non-transitory computer-readable storage media of claim 16, wherein the plurality of predefined transducers includes one or more sensors or one or more actuators.

19. The non-transitory computer-readable storage media of claim 16, wherein the instructions, when executed, are further operable to:
provide one or more user-adjustable controls on a front panel of the graphical programming environment for interaction with at least part of the CAD model or the CAD environment.

20. The non-transitory computer-readable storage media of claim 16, wherein the generation of one or more control signals is in response to the one or more transducer signals.

21. The non-transitory computer-readable storage media of claim 16, wherein the instructions, when executed, are further operable to:
set at least one parameter of a predefined transducer with a value that adapts the predefined transducer to approximate a particular physical transducer.

22. The non-transitory computer-readable storage media of claim 16, wherein the graphical program is embodied in a block diagram.

23. A method, comprising:
creating a geometrically representative dimensional CAD model of a physical system in a Computer Aided Design (CAD) environment configured to display the CAD model, the CAD model having one or more controllable features;
adding one or more transducers to the CAD model;
connecting the one or more transducers to one or more of the controllable features of the CAD model in the CAD environment;
simulating the CAD model having the one or more selected transducers to produce one or more transducer signals;
configuring a graphical program of a graphical programming environment, the graphical program configured to:
generate and send one or more control signals to the one or more transducers in the CAD environment to control the controllable features of the CAD model in response to receiving the one or more transducer signals,
receive one or more returned signals from the CAD environment based on the control of the controllable features, and
generate and send one or more additional control signals in reaction to the returned signals from the CAD environment;
executing the graphical program from within the CAD environment to control the controllable features of the CAD model; and
displaying, by the CAD environment in response to the executing, the control of the controllable features based on the control signals sent to the one or more transducers from the graphical program of the graphical programming environment.

* * * * *